United States Patent
Yamamoto (10) Patent No.: US 8,803,182 B2
(45) Date of Patent: Aug. 12, 2014

(54) LIGHT EMITTING DEVICE COMPRISING PROTECTIVE ELEMENT AND BASE

(75) Inventor: Saiki Yamamoto, Kowloon (HK)

(73) Assignee: Nichia Corporation, Anan-Shi (JP)

( * ) Notice: Subject to any disclaimer, the term of this patent is extended or adjusted under 35 U.S.C. 154(b) by 88 days.

(21) Appl. No.: 12/711,041

(22) Filed: Feb. 23, 2010

(65) Prior Publication Data

US 2010/0213499 A1    Aug. 26, 2010

(30) Foreign Application Priority Data

Feb. 24, 2009  (JP) .................................. 2009-040060
Jan. 28, 2010  (JP) .................................. 2010-016109

(51) Int. Cl.
*H01L 33/48*    (2010.01)

(52) U.S. Cl.
USPC .................................... 257/99; 257/E33.058

(58) Field of Classification Search
USPC .............................. 257/99, E33.058, E33.066
See application file for complete search history.

(56) References Cited

U.S. PATENT DOCUMENTS

| | | | |
|---|---|---|---|
| 6,054,716 A | | 4/2000 | Sonobe et al. |
| 6,060,729 A * | | 5/2000 | Suzuki et al. .................... 257/99 |
| 7,129,638 B2 * | | 10/2006 | Ng ................................. 313/512 |
| 7,876,593 B2 * | | 1/2011 | Wang et al. ....................... 365/56 |
| 2006/0267040 A1 | | 11/2006 | Baek et al. |
| 2008/0043477 A1 * | | 2/2008 | Yamamoto et al. ........... 362/362 |
| 2008/0298063 A1 | | 12/2008 | Hayashi |

FOREIGN PATENT DOCUMENTS

| | | |
|---|---|---|
| JP | 11-054804 A | 2/1999 |
| JP | 11-289110 A | 10/1999 |
| JP | 2002-222993 | 8/2002 |
| JP | 2006-93697 A | 4/2006 |
| JP | 2006-339640 A | 12/2006 |
| JP | 2007-280983 A | 10/2007 |
| JP | 2008-4640 A | 1/2008 |
| JP | 2008-84943 A | 4/2008 |
| JP | 2008-300694 A | 12/2008 |
| KR | 10-2006-0087048 A | 8/2006 |
| KR | 10-0769720 B1 | 10/2007 |

OTHER PUBLICATIONS

Chinese Office Action for corresponding Chinese Application No. 201010161717.6 dated Aug. 21, 2013 with English translation.

* cited by examiner

*Primary Examiner* — Wensing Kuo
(74) *Attorney, Agent, or Firm* — Birch, Stewart, Kolasch & Birch, LLP (57) ABSTRACT

To provide a light emitting device that is compact and has high efficiency of extracting light comprising a support body that incorporates a light emitting element.
The light emitting device has the protective element 106 mounted on the electrically conductive member 103*a* and the base 105 mounted on the electrically conductive member 103*a*, while at least part of the protective element 106 is covered with the base 105, and the light emitting element 104 is mounted on the top surface of the base 105.

33 Claims, 4 Drawing Sheets

LIGHT EMITTING DEVICE COMPRISING PROTECTIVE ELEMENT AND BASE

BACKGROUND OF THE INVENTION

1. Field of the Invention

The present invention relates to a light emitting device that uses a semiconductor light emitting element, and particularly to a light emitting device having a protective element (or protection element) mounted therein.

2. Description of the Related Art

In recent years, light emitting devices of surface mounting type have been widely used in place of light emitting devices of lamp type.

The light emitting device of surface mounting type has such a constitution as a light emitting element is provided in a support body (package), and lead frame terminals are formed integrally as positive and negative electrodes to which positive and negative electrodes of the light emitting element are connected, respectively. The light emitting device is required to have a higher electrostatic withstanding voltage (or electrostatic discharge withstand voltage), when it is used in a place prone to the influence of static electricity. Accordingly, a protective element such as zener diode is provided in the vicinity of the light emitting element (refer, for example, to JP H11-54804 A).

However, in case a protective element is provided in the vicinity of the light emitting element on the support body, it is necessary to secure a sufficient space for mounting the protective element and for bonding wires. As a result, it is necessary to make the lead frame and the support body larger in size, thus imposing a limitation to the size reduction of the light emitting device. There is also such a problem that light emitted by the light emitting element is absorbed or blocked by the protective element, resulting in a decrease in the efficiency of extracting light for the light emitting device as a whole.

SUMMARY OF THE INVENTION

The present invention has been made so as to solve the problems described above. An object of the present invention is to provide a light emitting device that is compact and has high efficiency of extracting light, comprising a support body that incorporates a protective element.

In order to achieve the object described above, the light emitting device of the present invention has such a constitution that has a protective element mounted on an electrically conductive member and a base (or a mounting) disposed on the electrically conductive member, wherein at least part of the protective element is covered with the base and the light emitting element is mounted on the top surface of the base.

The protective element is preferably entirely included in the base.

In the light emitting device, it is preferable that the electrically conductive member is disposed on the support body, and the base is formed to protrude from the support body.

The support body and the base may be formed in a single piece from the same material.

The support body and the base may also be formed from different materials.

It is preferable that the support body has a recess and the base is housed in the recess.

It is also preferable that a part of the electrically conductive member is exposed through the bottom of the recess, and that the exposing electrically conductive member is connected by a wire with the light emitting element.

It is also preferable that a part of the side surface of the base is connected with the wall surface that forms the recess and is formed integrally therewith.

The present invention makes it possible to provide a light emitting device that is compact and has high efficiency of extracting light by using a support body that incorporates a protective element.

DETAILED DESCRIPTION OF THE INVENTION

Embodiments according to the present invention will be described below with reference to the accompanying drawings. It should be noted, however, that the embodiment described below is shown for the purpose of exemplifying a form of the light emitting device that embodies the technical philosophy of the present invention, and the present invention is not restricted to that described below. In this specification, members described in claims of patent are not restricted to those described in the embodiment. Particularly, dimensions, materials, shapes and relative positions of the components described in the embodiment are mere examples given for explanation, and are not intended to restrict the scope of the invention. Sizes and positional relations of the components shown in drawings may be exaggerated to make the explanation clearer. Also in the description that follows, identical name or reference numeral represents the identical or similar members, for which duplicate description of the detail will be avoided. Moreover, components that constitute the present invention may be replaced by one member that is formed from a plurality of components. Conversely, function of one member may be realized by a plurality of components each performing a part of the function. Description given for some of the Examples or embodiments may be applicable to other Example or embodiment.

FIRST EMBODIMENT

Figure 1:
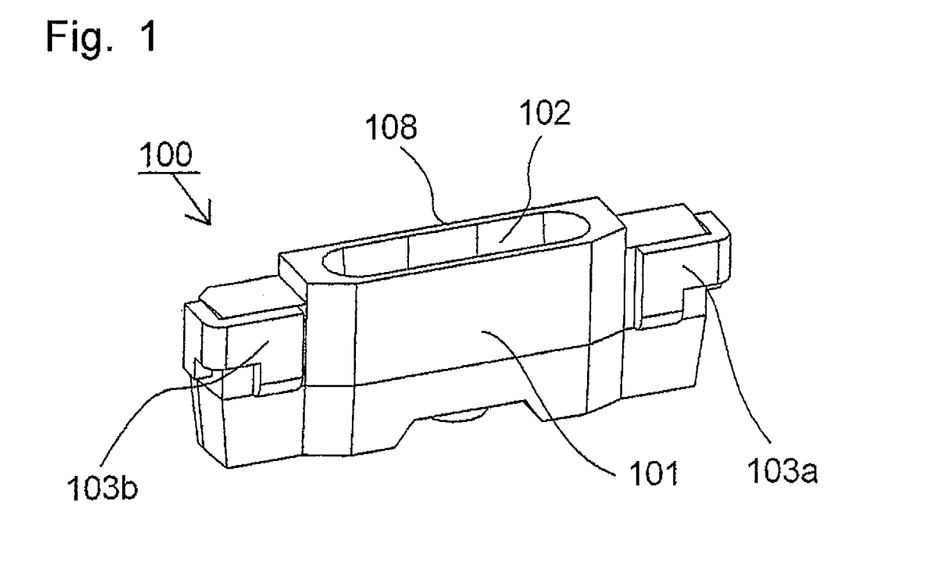
FIG. 1 is a perspective view showing an embodiment of a light emitting device according to the present invention.
Figure 2:
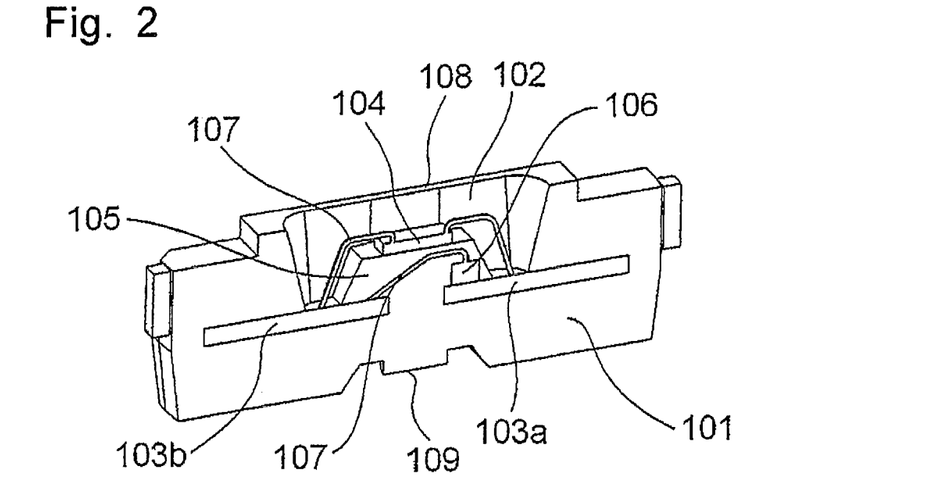
FIG. 2 is a perspective view schematically showing a section in the embodiment of the light emitting device according to the present invention.
Figure 3:
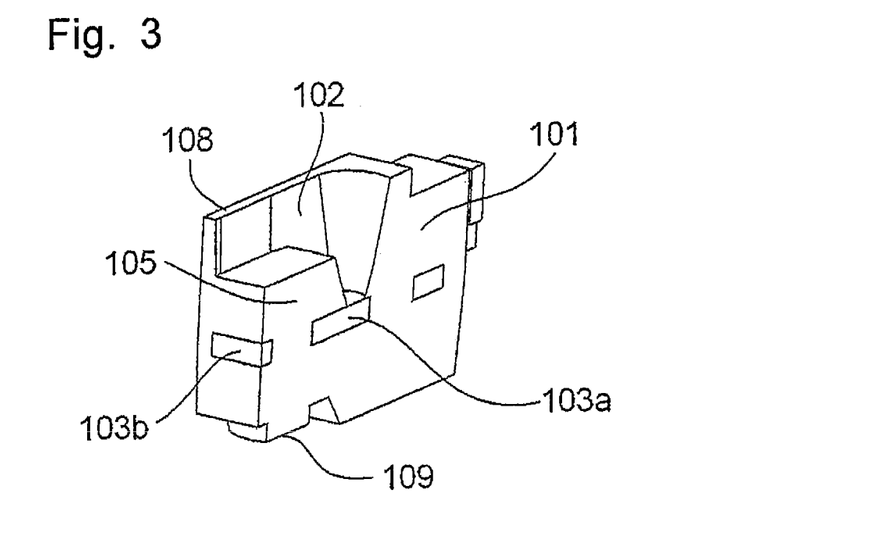
FIG. 3 is a sectional view showing a part of the light emitting device according to the present invention.

FIG. 1 to FIG. 3 show an embodiment of the present invention, FIG. 1 being a schematic perspective view of the light emitting device in overview, FIG. 2 being a perspective view of a section of the light emitting device, and FIG. 3 being a partial perspective view of a section of the light emitting device.

As shown in FIG. 2, the light emitting device 100 has a protective element 106 mounted on an electrically conductive member 103a and a base 105 mounted on the electrically conductive member 103a. The protective element 106 is included (entirely included) in the base 105, and a light emitting element 104 is mounted on the top surface of the base 105. This structure of entirely including the protective element 106 in the base 105 provides such effects as described below. First, since the mounting surface for the protective element 106 and the mounting surface for the light emitting element 104 do not lie in the same plane, it is not necessary to secure large areas for mounting the protective element 106 and for bonding a wire 107, and therefore it is unnecessary to make a pair of electrically conductive members 103a, 103b and a support body 101 large in size. The problem that light emitted by the light emitting element 104 is absorbed by the protective element 106 is eliminated, so that the light emitting device that is compact and has high efficiency of extracting light can be made.

In this embodiment, as shown in FIG. 1 and FIG. 2, the electrically conductive members 103a and 103b are disposed on the surface of the support body 101, and a recess 102 is formed in the support body 101. The support body 101 also has the positive and negative electrically conductive members 103a and 103b secured integrally by the support body 101 (i.e. electrically conductive members 103a and 103b are secured so that at least part thereof is included in the support body 101). Moreover, in the light emitting device 100 of this embodiment, as shown in FIG. 2, the base 105 is formed integrally with the support body 101 in the recess 102 of the support body 101 (i.e. the base 105 is secured to the support body 101 in the recess 102), while the protective element 106 and the wire 107 that electrically connects the protective element 106 and the electrically conductive member 103b are entirely included in the base 105. Moreover, the light emitting element 104 is mounted on top of the base 105, and is electrically connected by the wire 107 with the electrically conductive members 103a and 103b that are exposed through the bottom of the recess 102. By housing the base 105 in the recess 102, it is made possible to dispose the light emitting element 104 at a position closer to a opening (or the mouth) of the recess 102. In other words, the light emitting element 104 can be disposed at a higher position compared to a case in which the light emitting element 104 is mounted at the bottom of the recess 102, thus making it possible to decrease the amount of light absorbed within the recess 102 and improve the efficiency of extracting light.

As the base 105 is mounted between the positive and negative electrically conductive members 103a and 103b, the electrically conductive members 103a and 103b are completely isolated from each other by the material that forms the support body, and therefore the distance between the electrically conductive members 103a and 103b becomes far greater than that of a case in which the base 105 is not provided. As a result, the electrically conductive member such as the lead frame can be dramatically improved in the tolerance thereof against ion migration, thus making the light emitting device operable in such an environment that formerly prohibited the use of the light emitting device. Components of the light emitting device 100 of this embodiment will be described below.

Support Body 101

The support body 101 may be formed from any material as long as the electrically conductive members 103a and 103b can be disposed thereon, and the protective element 106 can be mounted thereon while maintaining electrical insulation for the light emitting element 104, the protective element 106 and the electrically conductive members 103a and 103b. For example, a thermoplastic resin or a thermosetting resin may be used. Specific examples thereof include polyphthalamide (PPA), a polycarbonate resin, polyphenylene sulfide (PPS), a liquid crystal polymer (LCP), an ABS resin, an epoxy resin, a phenol resin, an acrylic resin, a PBT resin, a glass epoxy resin, a BT resin and ceramics. Preferably a thermoplastic resin is used. These resins may be used in the form of a composition containing a reinforcing filler. While a glass fiber is commonly used, a fiber reinforced composition containing a carbon fiber, a polyamide fiber, a potassium titanate fiber, a gypsum fiber, a brass fiber, a steel fiber, a ceramic fiber, a boron whisker or the like, or an inorganic filler reinforced composition containing asbestos, mica, talc, silica, calcium carbonate, glass, clay, wollastonite, titanium oxide or the like may be used in various forms such as powder, granule, flakes or beads.

The support body 101 may have the recess 102 formed therein for accommodating the base 105 that carries the light emitting element 104 mounted thereon. In this case, it is preferable that side surfaces of the recess 102 are tapered so as to expand toward the mouth. The lead frames 103a and 103b are partially exposed at the bottom of the recess 102, so as to make it possible to establish electrical continuity by connecting the exposed surfaces with the positive and negative electrodes of the light emitting element 104 by means of the wires 107.

The support body 101 may not have the recess 102. In this case, the support body 101 is formed in plate shape and the base 105 is formed to protrude from the surface of the plate-shaped support body 101.

Base 105

The base 105 is a part that includes entirely (or encompasses) the protective element 106 and functions as a mount (or a mounting) for the light emitting element 104. The base 105 may be formed in a process different from that of forming the support body 101 from either the same or different material, or may be formed integrally with the support body 101 simultaneously. Inside of the base 105 may be either empty or filled with a molded member. The term "entirely included (or encompassed)" used in this specification means such a state as the protective element 106 is completely covered on the outer surface thereof or, in case the bottom surface of the protective element 106 is mounted on the electrically conductive member, side surface and the top surface of the protective element are covered so as not be exposed to the outside.

Since the surface of the protective element 106 is not exposed within the recess 102 of the base 105, the light emitted from the light emitting element 104 is not absorbed by the protective element 106. As a result, the light emitted from the light emitting element 104 can be extracted with higher efficiency in the light emitting device 100.

The embodiment as described in which the protective element 106 is entirely included in the base 105 is a preferred embodiment according to the invention. However, the present invention is not limited to this embodiment and the present invention includes an embodiment wherein at least part of (the surface of) the protective element 106 is covered with the base 105.

That is, an embodiment in which a part of the protective element 106 is included in the base 105 and the rest of protective element 106 is located at the outside of the base 105 is included in the present invention.

In this embodiment, it is preferable that over half of the protective element 106 (e.g. more than 50% of the surface area of the protective element 106) is included in the base 105 and the rest of protective element 106 (e.g. less than 50% of the surface area of the protective element 106) is locate at the outside of the base 105.

When a part of protective element 106 is located at the outside of the base 105 and exposed from the base 105, the protective element 106 may be exposed from the upper surface and/or the side surface of the base 105. However, preferably the protective element 106 is not exposed from the top surface of the base 105.

The reason is that the top surface of the base 105 is used as the mounting surface of the light emitting element 104 and if a part of the protective element 106 is displaced on the mounting surface, a part of the light from the light emitting element 104 is absorbed. When a part of protective element 106 is exposed from the base 105, therefore the protective element 106 is preferably exposed from the lower part than the mounting surface.

Figure 4:
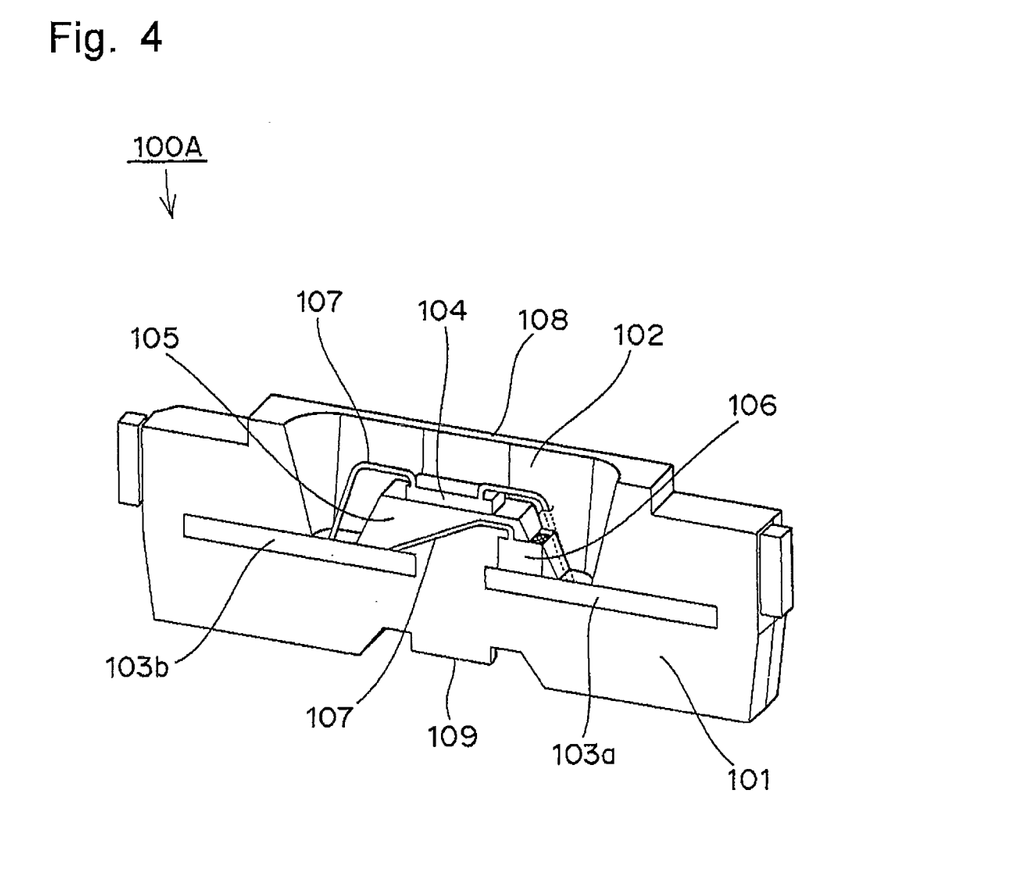
FIG. 4 is a perspective view showing another embodiment of a light emitting device according to the present invention.

FIG. 4 shows schematic perspective view in a section of a light emitting device 100A according to a preferred embodiment in which a part of the protective element 106 is located at the outside of the base 105.

In the light emitting 100A, the base 105 has a side surface formed as a stepped surface and a part of the upper surface of the protective element 106 is exposed from the step surface (i.e. exposed from the surface of the stepped side surface, which is approximately parallel to the top surface (mounting surface) of the base 105).

That is, over half part of the protective element 106 is included in the inside of the base 105, while a part of the upper surface of protective element 106 is located at the outside of the base 105. In other words, entire protective element 106, except for a part of upper surface thereof, is covered with the base 105.

In the case that a part of the protective element 106 is exposed from the base 105, the exposing area may be the upper surface of the protective element 106 as shown in FIG. 4 or may be side surface of the protective element 106.

In the embodiment shown in FIG. 4, wire 107 that electrically connects the protective element 106 with electrically conductive member 103*b* is entirely included in the base 105.

Figure 5:
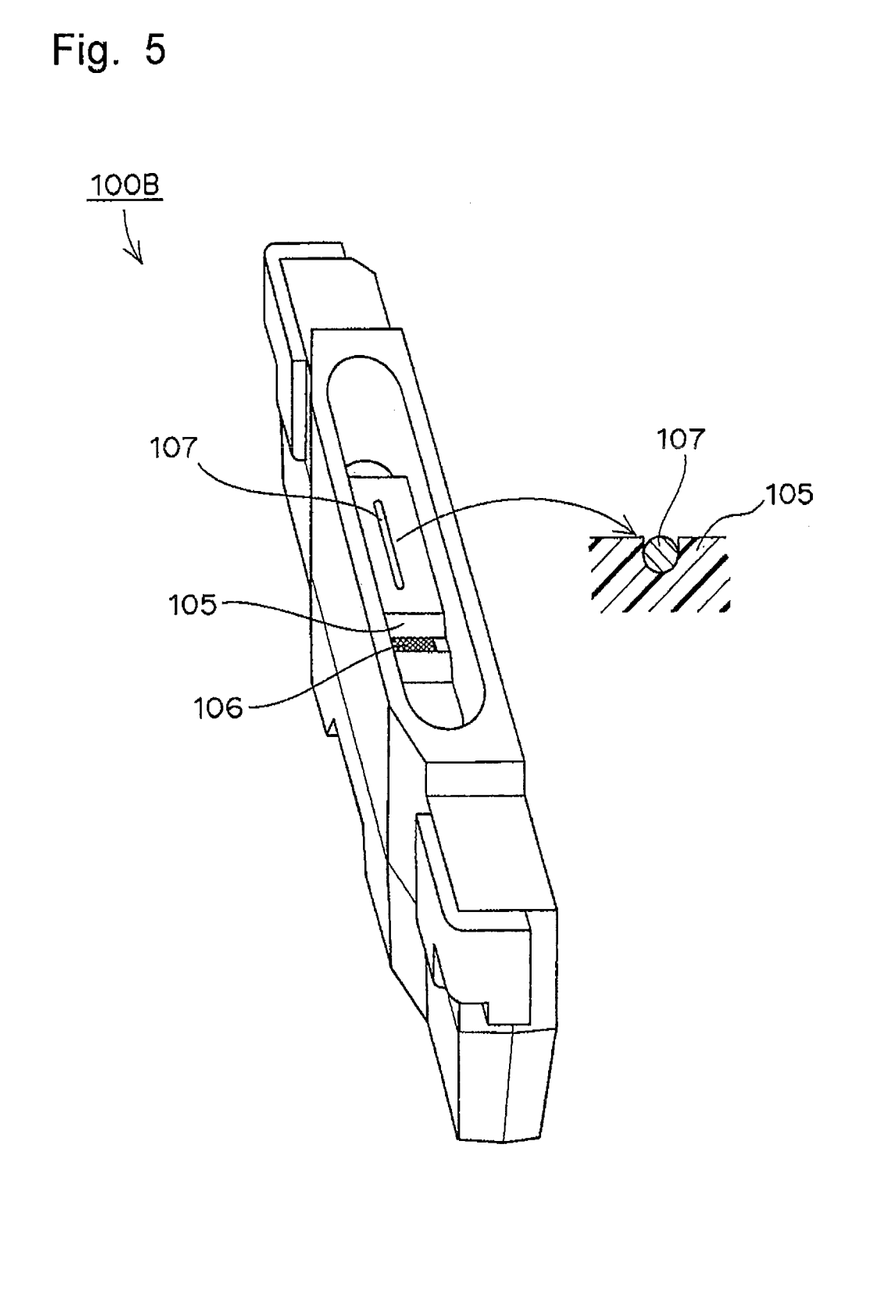
FIG. 5 is a perspective view showing yet another embodiment of a light emitting device according to the present invention.

However, a part of said wire 107 may be located at the outside of the base 105. FIG. 5 shows perspective view showing a light emitting device 100B in which a part of the wire 107 that electrically connects the protective element 106 with electrically conductive member 103*b* is located at the outside of the base 105.

In the light emitting device 100B, the wire 107 is exposed through the top surface of the base 105 that acts as the mounting surface of the light emitting element.

Since the area occupied by the wire 107, an element made of an inorganic material, is increased by the exposure of the wire 107, the deterioration of the base 105 is suppressed compared with that of a base of which outside is completely formed from a resin.

In addition, mounting errors (errors caused in a mounting process such as missing a mounting of an element) can be detected easily by checking the appearance of the base 105.

The wire may be exposed from the side surface of the base 105 as well as the upper surface of the base 105.

Shape of the base 105 may be the truncated pyramidal shape shown in FIG. 2, but is not limited to this and may be any shape that has a flat surface at the top such as truncated conical shape having round surface at the top, truncated conical shape having track configuration similar to the shape of the opening of the recess at the top, or rectangular parallelepiped.

When a thin light emitting device is formed, it is preferable that a part of side surface of the base 105 is formed integrally while being connected with the wall surface that forms the recess 102 as shown in FIG. 3. Size reduction of the support body that has the recess may involves problems that hamper stable operation of mass production such as occurrence of short mold due to loss of fluidity of resin during formation of the support body, deterioration of mold releasing due to rising ejection pressure of the resin and increasing burrs of the resin. Fluidity of the resin on the thin wall 108 can be improved so as to enable stable mass production of the thin wall 108, by connecting a part of the thin wall 108, that forms the recess 102 and is most difficult to form, to the base 105 within the support body as shown in FIG. 3 and forming the thin wall 108 by injection molding of resin. Also because the wall of such a small thickness that has been impossible to achieve with the prior art technology can be formed, a large surface area can be secured for mounting the light emitting element 104 within the limited overall size. As a result, a light emitting element having a larger light emitting area can be mounted on the light emitting device of a given overall size, so that the light emitting device that emits brighter light can be made. Moreover, as the base 105 is disposed on a gate mark 109 that is formed in a plane where the resin makes contact with the gate through which the resin is ejected, moldability can be improved further. This constitution is particularly effective for a support body that is difficult to form by injection molding, such as one wherein the surface that forms the opening of the recess 102 has lateral size (size parallel to shorter direction of the opening of the recess 102) 2 mm or less.

In the embodiment shown in FIG. 2, the base 105 is a truncated pyramid of which bottom surface is the bottom surface of the recess 102, and the side surfaces are formed to tilt with respect to the bottom surface so that the cross sectional area decreases toward the top where a flat top surface is formed. This configuration is preferable because it enables wire bonding without interference between the wire 107 and the base when connecting the electrodes of the light emitting element 104 to the electrically conductive members 103*a*, 103*b* by the wires 107. It is also preferable to dispose the electrically conductive member on the bottom surface of the base 105. The protective element can be entirely included in the base relatively easily by disposing the protective element 106 on the top surface of the electrically conductive member 103*a*, wire bonding the electrically conductive member 103*b* and the protective element 106 with the wire 107 and forming the base so as to cover the protective element 106 and the wire 107. As the electrically conductive members 103*a*, 103*b* are embedded in the base 105, it is made possible to dissipate the heat generated in the light emitting element 104 through the electrically conductive members 103*a*, 103*b*.

Height of the base 105 is, for example, from 50 to 400 µm.

Electrically Conductive Members 103*a*, 103*b*

The electrically conductive members 103*a*, 103*b* are electrically connected to the protective element 106 and the light emitting element 104. The electrically conductive members 103*a*, 103*b* may be either wiring patterns formed on the support body or lead frames embedded in the support body. The lead frame may have substantially plate-like shape, which may include either corrugated plate or a plate having bumps and recesses. The lead frame may be uniform in thickness, or may have locally thinner or thicker portion. While there is no restriction on the material used to form the lead frame, it is preferable to use a material that has relatively high heat conductivity. Use of such a material enables it to transfer and release the heat generated by the semiconductor element efficiently to the outside. When used for the light emitting device, for example, it is preferable to use a material that has heat conductivity of 200 W/(m·K) or higher or relatively high mechanical strength or that can be easily processed in such processes as stamping or etching. Specifically, metal such as copper, aluminum, gold, silver, tungsten, iron or nickel, or alloy such as iron-nickel alloy or phosphor bronze may be used. It is preferable that the lead frame is coated with reflective plating so as to efficiently extracting the light emitted by the light emitting element 104 mounted thereon. Glossiness of the lead frame surface that is coated with reflective plating is preferably 0.2 or higher, more preferably 1.0 or higher. The glossiness is the value determined by measuring with Densitmeter Model 144 manufactured by GAM (Graphic Arte Manufacturing) Company. A higher GAM value means higher glossiness and a smaller GAM value means lower glossiness.

As the light emitting device becomes smaller in size and thinner, the portion of the lead frame that is embedded and fastened in the support body 101 becomes smaller, and therefore it is preferable to form an anchor in the portion that is embedded in the support body. It is preferable to form a notch or bump at a position that achieves anchoring effect in the direction in which the lead frame protrudes from the surface of the support body, since this makes it possible to secure the lead frame and increase the strength.

In this embodiment, the electrically conductive member is a lead frame, and the electrically conductive members 103a, 103b are embedded in the support body 101, with a part of the surfaces thereof being exposed in the recess 102, and are connected with the light emitting element 104 by wire bonding on the exposed portion. For the wire 107, it is preferable to use a material that makes good ohmic contact with the electrode of the light emitting element 104, or has good mechanical connectivity or high electrical conductivity and high heat conductivity. Heat conductivity is preferably about 0.01 cal/S·cm$^{2\cdot\circ}$ C./cm or higher, and more preferably about 0.5 cal/S·cm$^{2\cdot\circ}$ C./cm or higher. The thickness of the wire is preferably from about 10 μm to 45 μm in diameter in consideration of workability. The material of the wire may be a metal such as gold, copper, platinum or aluminum, or an alloy thereof.

As shown in FIG. 1, the electrically conductive members 103a, 103b are protruded from one side facing in the direction of shorter side at the end in the longitudinal direction of the recess 102 of the support body 101 toward the outside of the support body 101 and bent, and function as external terminals. There is no restriction on the shape and the protruding direction of the lead frame provided as the electrically conductive member, which may be determined in consideration of the type of mounting (such as side view type, top view type, etc.).

Light Emitting Element 104

A semiconductor light emitting element such as LED can be preferably used as the light emitting element.

The light emitting element 104 is electrically connected to the electrically conductive members 103a, 103b that feed electric power to the light emitting element 104. For the light emitting element 104, semiconductor light emitting element made by epitaxial growth of semiconductor layer on a growth substrate is preferably used. For the growth substrate, known materials such as sapphire, spinel, SiC, GaN, GaAs or the like may be used. Instead of an insulating substrate such as sapphire, an electrically conductive substrate may also be used such as SiC, GaN or GaAs and p electrode and n electrode may be disposed to oppose each other.

As required, a wavelength converting material may be disposed around the light emitting element 104 so as to transform the light emitted by the light emitting element into light of different wavelength that is output. The wavelength converting material is formed by mixing a phosphor, that is excited by the light from the light emitting element and produces fluorescence, in a translucent material that fills the recess 102. This makes it possible to transform the light emitted by the light emitting element into light of a longer wavelength and extract light produced by blending the light emitted by the light emitting element and the light of longer wavelength produced by the wavelength converting material.

The light emitting element 104 is secured onto the surface of the base 105 by using a bonding material in die bonding process. For the bonding material, for example, an epoxy resin, a silicone resin or the like may be used.

Translucent Material

The recess 102 is preferably sealed with a translucent material. The translucent material protects the light emitting element 104 from external forces, moisture and other factors, and also protects the wires 107. For the translucent material, a transparent resin that has good weather resistance such as an epoxy resin, a silicone resin, a modified silicone resin, an acrylic resin or a urea resin or glass may be used.

The translucent material may contain optionally a filler, diffuser or a dispersant dispersed therein. A wavelength converting layer may also be provided by mixing a wavelength converting material such as a phosphor. The diffuser diffuses light, and is capable of decreasing the directivity thereby to increase the view angle. The phosphor transforms the light from the light emitting element 104, converting the wavelength of the light from the light emitting element 104 to that which is emitted to the outside of the support body 101. In case the light emitting element 104 emits visible light of a short wavelength having high energy, various materials may be preferably used including organic phosphor such as a derivative based on perylene, ZnCdS:Cu or YAG:Ce and inorganic phosphor such as CaO—Al$_2$O$_3$—SiO$_2$ activated with Eu and/or Cr. In case the light emitting device is used to produce white light, the use of YAG:Ce phosphor makes it possible to produce white light relatively easily with high reliability from the light emitted by a blue light emitting element and yellowish light that is complimentary to the color of the light and is emitted by absorbing a part of the light depending on the content of the material. Similarly, when CaO—Al$_2$O$_3$—SiO$_2$ phosphor activated with Eu and/or Cr is used, it is made possible to produce white light relatively easily with high reliability from the light emitted by the blue light emitting element and reddish light that is complimentary to the color of the light and is emitted by absorbing a part of the light, depending on the content of the material.

The translucent material is applied to the recess 102 to fill therein by dripping the resin. When the depth of the recess 102 is made smaller for the purpose of decreasing the amount of light absorbed in the recess 102 so as to improve the efficiency of extracting light, the volume of the recess 102 decreases and the quantity of the resin that fills therein is subjected to variation. In this embodiment, the light emitting element 104 can be mounted by means of the base 105 at such a height as light is less likely to be absorbed in the recess while ensuring a certain depth of the recess, and therefore the variation of the quantity of the resin that fills the recess has less influence. This is one of advantages of this embodiment. In case a phosphor is contained in the translucent material, quantity of the phosphor varies as the quantity of resin varies, thus resulting in variability in the light color. Variation in the quantity of resin that fills the recess is preferably small also for this reason.

Protective Element 106

Protective element is an element that performs at least one of (1) function to suppress a reverse voltage from being applied to the light emitting element, and (2) function to suppress a forward voltage higher than a predetermined voltage that is higher than the operating voltage of the light emitting element from being applied to the element. Use of the protective element increases the electrostatic withstanding voltage of the light emitting device.

There is no restriction on the protective element 106 disposed in the base 105, and any of the known devices that are mounted in light emitting devices may be used. For example, zener diode, avalanche diode, switching diode, Schottky diode or the like may be used. It is preferable to dispose one of the positive electrode and the negative electrode of the protective element 106 on the front side and the other of the positive electrode and the negative electrode of the protective element 106 on the back side, which enables die bonding of one electrode via an electrically conductive adhesive on the lead frame. When the positive electrode and the negative electrode are disposed on the same side, it is made possible to mount by wire bonding or flip-chip bonding via a bump or the like. Flip-chip bonding enables it to establish electrical continuity by connecting electrodes to the lead frames so as to straddle over the lead frames that are disposed side by side.

Figure 6:
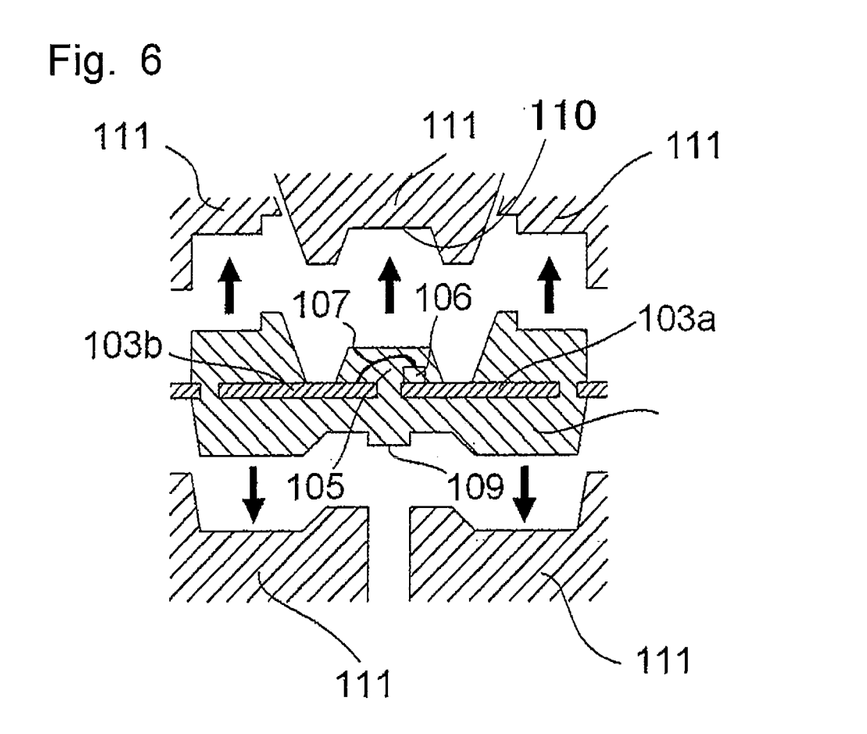
FIG. 6 is a diagram showing an example of a method for manufacturing the light emitting device of the present invention.

It is preferable to mount the protective element on a portion that would become the base 105 and establish electrical continuity by wire bonding or flip-chip bonding via a bump or the like, before forming the support body 101 by injection molding. As shown in FIG. 6, the base 105 can be formed by forming a recess that corresponds to the base 105 in a metal mold 111 used to form the support body, and carrying out injection molding of resin that forms the support body in the recess. At this time, when attention is given to top of the protective element 106, the molding resin is placed to fill up to the portion that would become the bottom surface 110 of the recess (top surface of the base) of the metal mold 111. There is a possibility that the wire 107 that connects the protective element 106 would be broken by the flowing resin during injection molding. However, since there is discontinuity at the bottom surface 110 of the recess of the metal mold, the wire would not be pulled toward the top surface of the protective element 106, so that the wire 107 can be suppressed from being bent or broken. Even when a part of the wire is exposed through the top surface of the base 105, it is made possible to mount the light emitting element without the possibility of short circuiting to occur, by using the light emitting element having the semiconductor layer formed on the insulating substrate.

EXAMPLES

Examples of the present invention will be described below regarding the manufacturing method according to the present invention. The manufacturing method described below is a mere example and the light emitting device may also be manufactured by another method.

Example 1

A method for manufacturing a light emitting device shown in FIG. 1 to FIG. 3 will be described as Example 1, by making reference to FIG. 2 to FIG. 4. The light emitting device 100 in this Example is a light emitting device of side view type measuring 3.8 mm in length, 1.2 mm in width and 0.6 mm in thickness with the recess 102 that is 0.6 mm in depth.
First Step First, a lead frame that has been formed in a predetermined shape by pressing and is coated with Ag plating is used as the electrically conductive member (hereinafter the electrically conductive members 103a, 103b will be referred to as the lead frame). A back electrode of the protective element 106 is die-bonded onto the lead frame 103a using an Ag paste, and the top electrode of the protective element 106 and the lead frame 103b are wire-bonded. The protective element 106 measuring 0.24 mm square and 0.14 mm in thickness is used, and an Au wire about 25 μm in diameter is used. The distance between the lead frames 103a and 103b is set to about 0.6 mm.
Second Step Then the lead frames 103a and 103b are disposed in the metal mold 111, and the resin is injected for molding the support body. As shown in FIG. 6, the metal mold 111 has the recess that corresponds to the base 105, and the resin is poured into the recess with the protective element 106 and the wire 107 being housed therein. Thus the base 105 having the protective element 106 embedded therein is formed. The gate mark 109 through which the resin is injected is positioned at the bottom of the base 105. Part of the lead frames 103a and 103b are exposed on both sides of the base 105 in the bottom surface of the recess 102 of the support body, namely the surface that is flush with the bottom surface of the base 105. A pair of side surfaces of the base 105 is formed integrally while being connected with the wall surface 108 that forms the recess 102, thus improving the moldability of the thin wall. Protruding height of the base 105 is about 0.3 mm, and thickness of the thin wall is about 0.1 mm. The base 105 has a truncated pyramid shape with a pair of side surfaces being formed to tilt so that the cross sectional area decreases toward the top. This configuration is preferable because the side surfaces serve as mold release taper during the molding process, and the wires that connect the electrodes of the light emitting element 104 and the lead frames 103a, 103b can be suppressed from hitting the corner of the base 105 and cause interference in the base 105 thus obtained.
Third Step Then the light emitting element 104 is die-bonded onto the top surface of the base 105 by means of epoxy resin, and the electrodes of the light emitting element 104 and the lead frames 103a, 103b that are exposed from the bottom of the recess of the support body are wire-bonded using Au wires. Since the junction between the lead frame and the wire is located at a height below the mounting surface of the light emitting element 104, wire loop does not protrude higher, namely toward the opening of the recess 102 than in the case of carrying out wire bonding in the same plane as the mounting surface of the light emitting element 104. As a result, it is made possible to bring the top surface of the light emitting element 104 and the opening of the recess nearer to each other.
Fourth Step Then the recess 102 is sealed off with a translucent material (not shown) composed of a silicone resin including YAG phosphor.
Fifth Step Last, the lead frames 103a, 103b that protrude from the outer surface of the support body 101 to the outside are bent at the ends thereof so as to run along the support body, thus completing the light emitting device of side view type.

The light emitting device obtained as described above has very thin construction and high efficiency of extracting light, and shows high reliability because the protective element is entirely included (or incorporated) in the base.

Example 2

Figure 7:
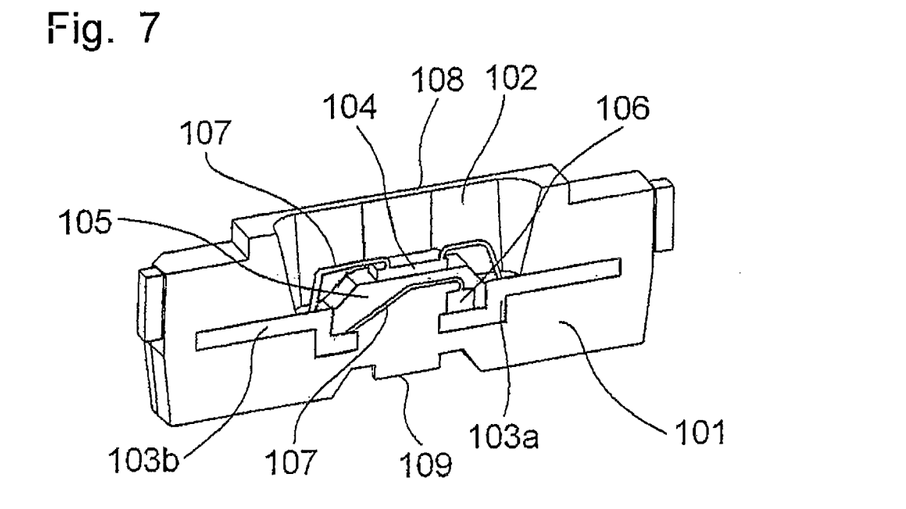
FIG. 7 is a perspective view showing still yet another embodiment of a light emitting device according to the present invention.

The light emitting device as shown in FIG. 7 can be made similarly to Example 1 except for providing a step in the portion where the lead frames 103a and 103b oppose each other, placing the protective element 106 at a position lower than the surface that is exposed in the bottom of the recess, and wire-bonding the protective element 106 and the wire 107.

The light emitting device can be used as the light source for various applications such as illumination, various indicators, onboard light of automobile, display, backlight of liquid crystal, traffic light, onboard components of automobile and channel letter of sign board.

The present application claims priority based on Japanese Patent Applications No. 2009-040060 and No. 2010-016109. The disclosures of Japanese Patent Applications No. 2009-040060 and No. 2010-016109 are incorporated by reference herein.

What is claimed is:

1. A light emitting device comprising:
    a protective element mounted on an electrically conductive member; and
    a base disposed on the electrically conductive member,
    wherein at least part of the protective element is covered with the base and a light emitting element is mounted on the top surface of the base, and said top surface of the base where the light emitting element is mounted is not coplanar with the electrically conductive member, and
    wherein a wire extends around a side surface of the base and downward to connect said light emitting element to said electrically conductive member, and
    wherein the electrically conductive member is disposed on a support body, and the support body and the base are formed in a single piece from the same material.

2. The light emitting device according to claim 1, wherein the protective element is entirely included in the base.

3. The light emitting device according to claim 1 or 2, wherein the electrically conductive member is disposed on the support body, and the base is formed so as to protrude from the support body.

4. The light emitting device according to claim 1, wherein the electrically conductive member is disposed on the support body, and the support body has a recess and the base is accommodated in the recess.

5. The light emitting device according to claim 4, wherein a part of the electrically conductive member is exposed from the bottom surface of the recess, and the exposed electrically conductive member and the light emitting element are connected with each other by wire.

6. The light emitting device according to claim 4 or 5, wherein a part of side surface of the base is connected with the wall surface of the recess and is formed integrally therewith.

7. The light emitting device as recited in claim 1, wherein
    said top surface of the base where the light emitting element is mounted, and
    a side surface of the base
form an angle larger than 90 degrees in the base.

8. The light emitting device as recited in claim 1, wherein a side surface of said base is inclined at a non-zero angle with respect to the electrically conductive member.

9. The light emitting device according to claim 1, wherein a part of an upper surface of the protective element is located at the outside of the base.

10. The light emitting device according to claim 1, wherein the base is a truncated pyramid shape.

11. The light emitting device according to claim 3, wherein the support body comprises a thermosetting resin.

12. The light emitting device according to claim 3, wherein the support body comprises a thermoplastic resin.

13. The light emitting device according to claim 4, wherein a part of a wall of the recess is tapered.

14. The light emitting device according to claim 4, wherein a lateral size of the recess is 2 mm or less.

15. The light emitting device according to claim 5, wherein a part of the wire is located at the outside of the base.

16. A light emitting device comprising:
    a protective element mounted on an electrically conductive member; and
    a base disposed on the electrically conductive member,
    wherein at least part of the protective element is covered with the base and a light emitting element is mounted on the top surface of the base, and
    wherein a side surface of the base, which is different from said top surface and protrudes above said electrically conductive member, contacts a translucent material, and
    wherein a wire extends around said side surface of the base and downward to connect said light emitting element to said electrically conductive member, and
    wherein the electrically conductive member is disposed on a support body, and the support body and the base are formed in a single piece from the same material.

17. The light emitting device according to claim 16, wherein the electrically conductive member is disposed on the support body, and the support body has a recess and the base is accommodated in the recess.

18. The light emitting device according to claim 17, wherein a part of the side surface of the base is connected with the wall surface of the recess and is formed integrally therewith.

19. A light emitting device comprising:
    a protective element mounted on an electrically conductive member; and
    a base disposed on the electrically conductive member,
    wherein at least part of the protective element is covered with the base and a light emitting element is mounted on the top surface of the base, and
    wherein the base protrudes from the topmost surface of the electrically conductive member, and
    wherein a wire extends around a side surface of the base and downward to connect said light emitting element to said electrically conductive member.

20. The light emitting device as recited in claim 19, wherein
    said top surface of the base where the light emitting element is mounted, and
    a side surface of the base
form an angle larger than 90 degrees in the base.

21. The light emitting device as recited in claim 19, wherein a side surface of said base is inclined at a non-zero angle with respect to the electrically conductive member.

22. The light emitting device according to claim 19, wherein the protective element is entirely included in the base.

23. The light emitting device according to claim 19, wherein the electrically conductive member is disposed on a support body, and the base is formed so as to protrude from the support body.

24. The light emitting device according to claim 19, wherein the electrically conductive member is disposed on a support body, and the support body has a recess and the base is accommodated in the recess.

25. The light emitting device according to claim 24, wherein a part of the electrically conductive member is exposed from the bottom surface of the recess, and the exposed electrically conductive member and the light emitting element are connected with each other by wire.

26. The light emitting device according to claim 24, wherein a part of side surface of the base is connected with the wall surface of the recess and is formed integrally therewith.

27. The light emitting device according to claim 19, wherein a part of an upper surface of the protective element is located at the outside of the base.

28. The light emitting device according to claim 19, wherein the base is a truncated pyramid shape.

29. The light emitting device according to claim 23, wherein the support body comprises a thermosetting resin.

30. The light emitting device according to claim 23, wherein the support body comprises a thermoplastic resin.

31. The light emitting device according to claim 24, wherein a part of a wall of the recess is tapered.

32. The light emitting device according to claim 24, wherein a lateral size of the recess is 2 mm or less.

33. The light emitting device according to claim 25, wherein a part of the wire is located at the outside of the base.

* * * * *